United States Patent
Yoon et al.

(10) Patent No.: US 12,433,394 B2
(45) Date of Patent: Oct. 7, 2025

(54) WAFER CLEANING BRUSH

(71) Applicant: Yunslab Co., Ltd., Siheung-si (KR)

(72) Inventors: Jeong Hye Yoon, Seoul (KR); Sung Taek Kim, Seoul (KR); Chi Hyung Kim, Seoul (KR)

(73) Assignee: Yunslab Co., Ltd., Siheung-si (KR)

( * ) Notice: Subject to any disclaimer, the term of this patent is extended or adjusted under 35 U.S.C. 154(b) by 0 days.

(21) Appl. No.: 18/391,532

(22) Filed: Dec. 20, 2023

(65) Prior Publication Data

US 2024/0415274 A1    Dec. 19, 2024

Related U.S. Application Data

(63) Continuation of application No. PCT/KR2023/010090, filed on Jul. 14, 2023.

(30) Foreign Application Priority Data

Jun. 15, 2023   (KR) ........................ 10-2023-0076578

(51) Int. Cl.
*A46B 11/06* (2006.01)
*A46B 9/02* (2006.01)

(52) U.S. Cl.
CPC .............. *A46B 11/06* (2013.01); *A46B 9/025* (2013.01); *A46B 9/026* (2013.01); *A46B 2200/3073* (2013.01)

(58) Field of Classification Search
CPC ......... A46B 11/06; A46B 9/025; A46B 9/026; A45B 2200/3073
See application file for complete search history.

(56) References Cited

U.S. PATENT DOCUMENTS 6,467,120 B1 * 10/2002 Ziemins ............ H01L 21/67046
                                                                15/97.1
12,131,896 B2 * 10/2024 Chen ........................ B08B 1/32

FOREIGN PATENT DOCUMENTS

KR    10-2005-0082323 A    8/2005
KR    10-2006-0001108 A    1/2006

* cited by examiner

*Primary Examiner* — Jennifer C Chiang
(74) *Attorney, Agent, or Firm* — Revolution IP, PLLC

(57) ABSTRACT

A wafer cleaning brush includes: a brush including a hollow formed inside the brush and through which a cleaning liquid is discharged, and a plurality of protrusions formed on an outer surface of the brush; and a film surrounding the outer surface of the brush, wherein the film includes a plurality of holes through which the protrusions pass.

6 Claims, 3 Drawing Sheets

WAFER CLEANING BRUSH

CROSS-REFERENCE TO RELATED APPLICATION

This application is a Continuation application of PCT International Patent Application No. PCT/KR2023/010090 filed on Jul. 14, 2023, which claims priority to Korean Patent Application No. 10-2023-0076578 filed on Jun. 15, 2023 in the Korean Intellectual Property Office (KIPO), the entire disclosure of which is incorporated herein by reference.

TECHNICAL FIELD

The present invention relates to a wafer cleaning brush.

BACKGROUND ART

In general, a semiconductor wafer process may include a plurality of processes such as an ion implantation process, a film deposition process, a diffusion process, a photolithography process, a surface polishing process, and a cleaning process to form a semiconductor element with multiple layers on a surface of a wafer that uses silicon as a main raw material.

Among such semiconductor wafer processing processes, there may be a wafer surface polishing process in which the surface of the wafer is polished while rotating the wafer at a high speed by using a chemical-mechanical polishing (CMP) device or the like.

In addition, the wafer surface polishing process or the like necessarily includes a wafer cleaning process in order to remove generated foreign substances, particles, or the like.

In this case, the wafer cleaning process may be performed in various ways by applying various types of semiconductor wafer cleaning devices as disclosed in Korean Unexamined Patent Publication No. 10-2005-82323.

For example, the wafer cleaning device may include a pair of cleaning brushes formed of a moisture retention sponge material and configured to clean a wafer while pressing the wafer while rotating in contact with front and rear surfaces of the wafer rotated by a guide roller, respectively.

However, due to soft material characteristics of the brush, the brush in the cleaning device according to the related art may have a problem in which a surface of the brush is not fixed upon the rotation through the roller, or the surface of the brush is deformed during use.

In addition, since contaminants are also adsorbed on the surface of the brush due to the contact between the surface of the brush and the surface of the wafer, a wafer cleaning effect may be reduced when the brush is reused.

DISCLOSURE

Technical Problem

An object of the present invention is to provide a wafer cleaning brush capable of improving durability and a cleaning effect.

Technical Solution

To achieve the object described above, according to one aspect of the present invention, there is provided a wafer cleaning brush including: a brush including a hollow formed inside the brush and through which a cleaning liquid is discharged, and a plurality of protrusions formed on an outer surface of the brush; and a film surrounding the outer surface of the brush, wherein the film includes a plurality of holes through which the protrusions pass.

Advantageous Effects

According to the present embodiment, strength of a brush can be reinforced through a film, so that rotational stability and durability of the brush can be improved.

In addition, discharge of a cleaning liquid through a region of the brush in which a protrusion is formed can be guided, and contaminants can be prevented from being adsorbed on a surface of the brush.

MODE FOR INVENTION

Hereinafter, exemplary embodiments of the present invention will be described in detail with reference to the accompanying drawings.

However, the technical idea of the present invention may be implemented in various different forms without being limited to some of embodiments that will be described below, and one or more of elements among the embodiments may be selectively combined or replaced with each other within the scope of the technical idea of the present invention.

In addition, unless explicitly and specifically defined and described otherwise, terms (including technical and scientific terms) used in an embodiment of the present invention may be interpreted as having meanings that may be generally understood by a person having ordinary skill in the art to which the present invention pertains, and meanings of any terms that are generally used, such as terms defined in a dictionary, may be interpreted in consideration of the contextual meanings in the relevant art.

In addition, terms used in the embodiment of the present invention are intended to describe embodiments without being intended to limit the present invention.

In the present disclosure, an expression in a singular form may also include a meaning of a plural form unless specifically described otherwise in a phrase, and when the expression "at least one (or one or more) of A, B, and C" is described, the expression may include one or more of all combinations that may be combined with A, B, and C.

In addition, while describing elements of the embodiment of the present invention, terms such as 'first', 'second', 'A', 'B', '(a)', and '(b)' may be used. The term is only intended to distinguish the element from other elements, and essence, an order, a sequence, or the like of the element is not limited by the term.

Further, when one element is described as being 'connected', 'coupled', or 'accessed' to another element, the expression may include not only a case where the element is directly 'connected', 'coupled', or 'accessed' to the other element, but also a case where the element is 'connected', 'coupled', or 'accessed' to the other element by another element that is present between the element and the other element.

In addition, when one element is described as being formed or disposed 'on (above)' or 'under (below)' of each element, the expression 'on (above)' or 'under (below)' may include not only a case where the two elements make direct contact with each other, but also a case where one or more other elements are formed or disposed between the two elements. In addition, when the expression 'on (above)' or 'under (below)' is described, the expression may include a meaning of not only an upward direction but also a downward direction based on one element.

Figure 1:
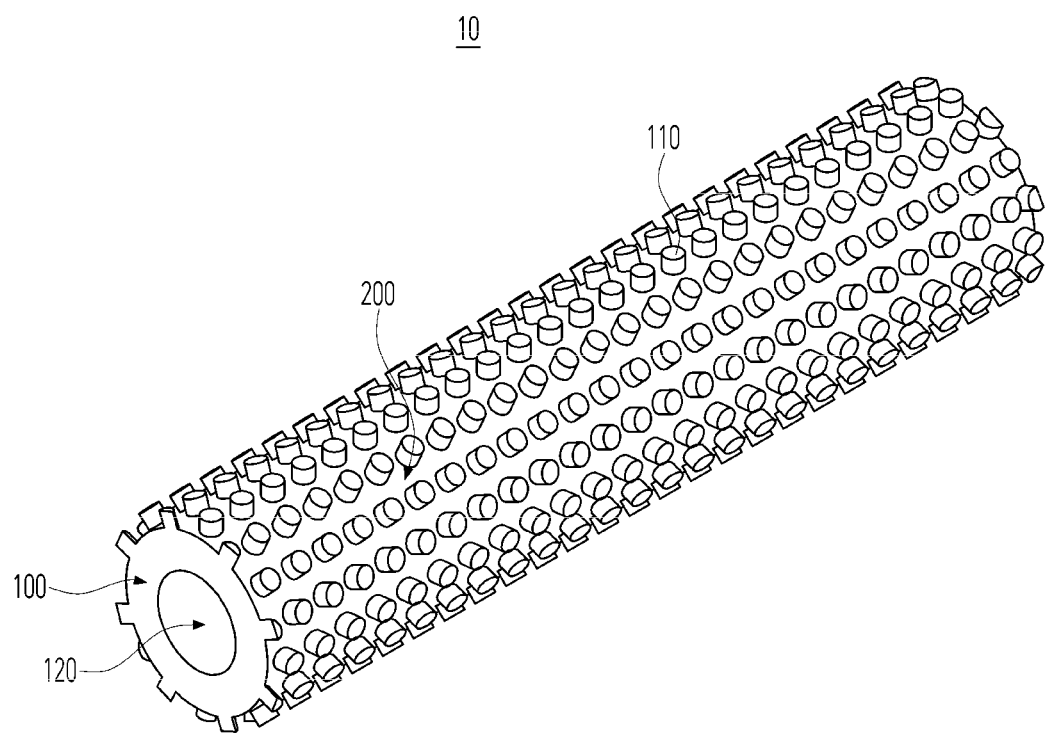
FIG. 1 is a perspective view showing an exterior of a wafer cleaning brush according to an embodiment of the present invention.
Figure 2:
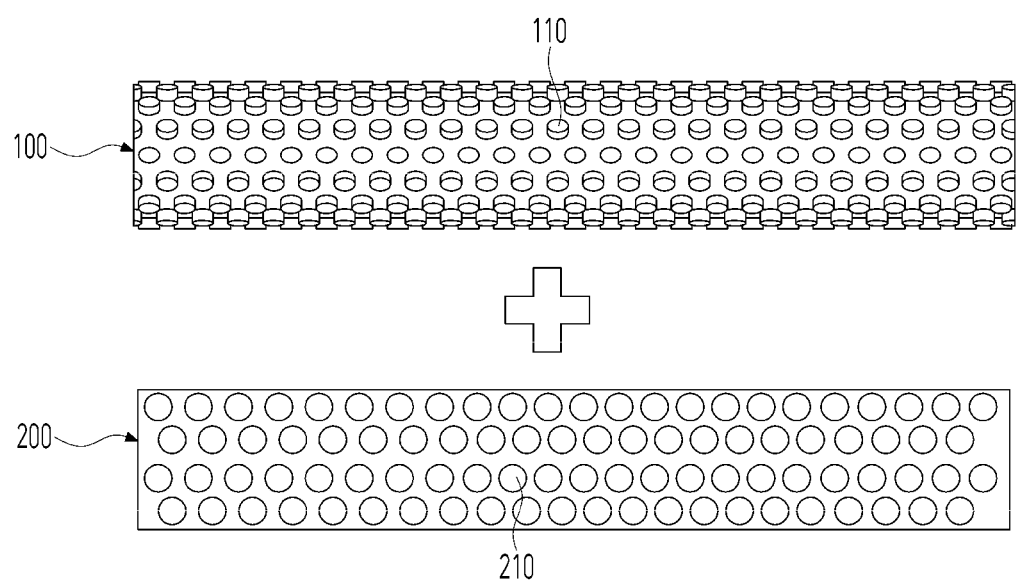
FIG. 2 is a plan view showing the wafer cleaning brush and a film surrounding the exterior of the wafer cleaning brush according to the embodiment of the present invention.
Figure 3:
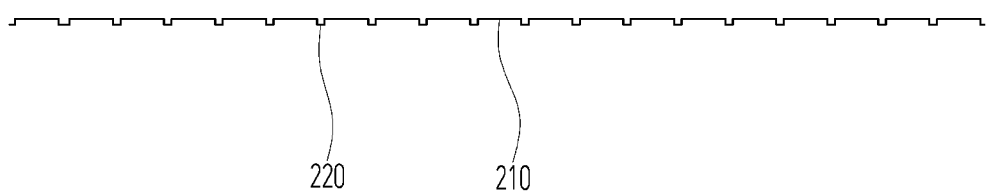
FIG. 3 is a sectional view showing the film according to the embodiment of the present invention.
Figure 4:
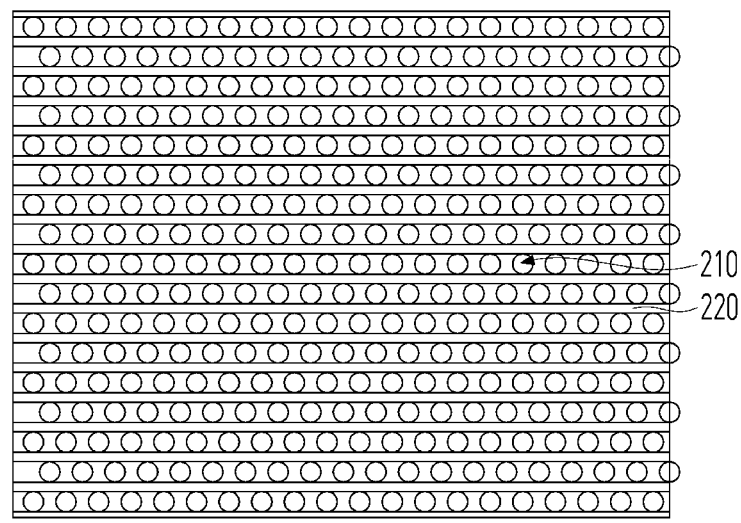
FIG. 4 is a plan view showing the film according to the embodiment of the present invention.

FIG. 1 is a perspective view showing an exterior of a wafer cleaning brush according to an embodiment of the present invention, FIG. 2 is a plan view showing the wafer cleaning brush and a film according to the embodiment of the present invention, FIG. 3 is a sectional view showing the film according to the embodiment of the present invention, and FIG. 4 is a plan view showing the film according to the embodiment of the present invention.

Referring to FIGS. 1 to 4, according to an embodiment of the present invention, a wafer cleaning brush 10 may include a brush 100 and a film 200 surrounding an exterior of the brush 100.

The brush 100 may have a cylindrical shape. The brush 100 may have a section having a ring shape. A hollow 120 may be formed at a center of the brush 100. The hollow 120 may be formed through the brush 100 from one surface of the brush 100 to an opposite surface of the brush 100. A rotation shaft (not shown) may be coupled to the hollow 120. The rotation shaft may be rotated by an operation of an actuator (not shown), so that the brush 100 may be rotated together with the rotation shaft.

According to the present embodiment, a wafer cleaning device may include a plurality of wafer cleaning brushes 10, and a wafer may be disposed between the wafer cleaning brushes 10 so as to be cleaned.

The brush 100 may be formed of a material through which a fluid passes. For example, the brush 100 may be formed of plastics, which are various polymer compounds. The hollow 120 may be provided with a cleaning liquid discharge part (not shown) configured to discharge a cleaning liquid in a radial direction of the brush 100, and the cleaning liquid discharged from the cleaning liquid discharge part may pass through of the brush 100 from an inner surface of the brush 100 to an outer surface of the brush 100 so as to be provided to the wafer.

The brush 100 may include a plurality of protrusions 110. Each of the protrusions 110 may have a shape that protrudes outward than other regions from the outer surface of the brush 100. The protrusions 110 may make contact with a surface of the wafer during a wafer cleaning process. Each of the protrusions 110 may have a circular sectional shape and various sectional shapes. The protrusions 110 may be spaced apart from each other in a longitudinal direction of the brush 100. The protrusions 110 may be spaced apart from each other in a circumferential direction of the brush 100. One protrusion 110 among the protrusions 110 may overlap a region between two protrusions 110 that are adjacent to each other in the circumferential direction.

The wafer cleaning brush 10 may include a film 200 surrounding the outer surface of the wafer cleaning brush 10. The film 200 may have a predetermined thickness, and may surround the outer surface of the brush 100. A material of the film 200 may include various materials such as polyethylene terephthalate (PET) or polyvinyl chloride (PVC).

The thickness of the film 200 may include various thicknesses such as 0.1 mm to 0.5 mm.

The film 200 may surround the outer surface of the brush 100 to prevent foreign substances from being adsorbed on the outer surface of the brush 100 during the wafer cleaning process.

The film 200 may include a plurality of holes 210. Each of the holes 210 may have a shape formed through the film 200 from an outer surface of the film 200 to an inner surface of the film 200. The holes 210 may be arranged on the film 200 to correspond to a region of the brush 100 in which the protrusions 110 are arranged. Each of the holes 210 may have a circular sectional shape and various shapes. A diameter of each of the holes 210 may be larger than a diameter of the protrusion 110. A sectional area of each of the holes 210 may be larger than a sectional area of the protrusion 110.

When the film 200 is coupled to the brush 100, the protrusion 110 may pass through the hole 210. Accordingly, the cleaning liquid provided from the hollow 120 within the brush 100 may be discharged to an outside through a region of the outer surface of the brush 100 in which the protrusions 110 are formed. In other words, the cleaning liquid may be discharged to the outside through the holes 210 of the film 200. Accordingly, the cleaning liquid may be discharged more uniformly and accurately on the surface of the wafer.

Meanwhile, as shown in FIGS. 3 and 4, a guide 220 having a shape that protrudes inward than other regions may be formed on the inner surface of the film 200, which faces the outer surface of the brush 100. The guide 220 may have a bar shape having a longitudinal direction in the longitudinal direction of the brush 100 or the film 200. A plurality of guides 220 may be provided and spaced apart from each other in the circumferential direction of the film 200. The guide 220 may allow the inner surface of the film 200 and the outer surface of the brush 100 to have a region in which the inner surface of the film 200 and the outer surface of the brush 100 are spaced apart from each other by a predetermined distance in the radial direction, so that the discharge of the cleaning liquid may be guided to a region of the film 200 in which the holes 210 are formed. In addition, the cleaning liquid may be prevented from stagnating between the inner surface of the film 200 and the outer surface of the brush 100 through a separation space provided by the guide 220.

Meanwhile, although not shown, a filter (not shown) may be provided on the outer or inner surface of the film 200. The filter may be formed in the form of a film attached to the outer or inner surface of the film 200. The filter may be a nonwoven fabric. Accordingly, the filter may prevent the surface of the film 200 or the surface of the brush 100 from being contaminated.

In addition, although not shown, a plurality of protrusion parts (not shown) configured to guide a flow of the cleaning liquid discharged from a region other than the protrusions 110 may be formed on the outer surface of the brush 100 or the inner surface of the film 200, in which a flow path through which the cleaning liquid flows may be formed between the protrusion part and an adjacent protrusion part, so that the cleaning liquid may be guided to be discharged through the region of the film 200 in which the holes 210 are formed.

Figure 5:
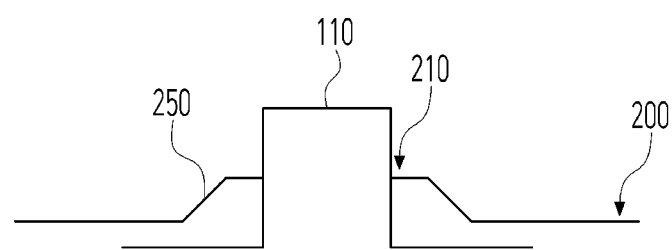
FIG. 5 is a sectional view showing a modified example of a coupling structure of the film and the brush according to the embodiment of the present invention.

FIG. 5 is a sectional view showing a modified example of a coupling structure of the film and the brush according to the embodiment of the present invention.

Referring to FIG. 5, the film 200 may include an inclined surface 250. The inclined surface 250 may be disposed on an outer side of the region where the holes 210 to which the protrusions 110 of the brush 100 are coupled are formed. The inclined surface 250 may have a shape in which a length in the radial direction to the outer surface of the brush 100 gradually becomes farther as the hole 210 becomes closer. The inclined surface 250 may allow the cleaning liquid provided from the brush 100 to be easily discharged to the outside through the hole 210.

According to the structure described above, strength of a brush can be reinforced through a film, so that rotational stability and durability of the brush can be improved.

In addition, discharge of a cleaning liquid through a region of the brush in which a protrusion is formed can be guided, and contaminants can be prevented from being adsorbed on a surface of the brush.

Although all elements constituting the embodiment of the present invention have been described above as being coupled to each other or as operating while being coupled to each other, the present invention is not necessarily limited to the embodiment. In other words, one or more of all the elements may be selectively coupled to each other to operate within the scope of the purpose of the present invention. In addition, since the term such as 'comprise', 'include', or 'have' described above means that the element corresponding to the term may be inherent unless specifically described to the contrary, the term has to be interpreted to mean that other elements may be further included but not excluded. Unless otherwise defined, all terms, including technical or scientific terms, have the same meanings as how they are generally understood by a person having ordinary skill in the art to which the present invention pertains. Any terms that are generally used, such as terms defined in a dictionary, shall be interpreted as having the same meanings as in the context of the relevant art, and shall not be interpreted as having idealistic or excessively formalistic meanings unless explicitly defined otherwise in the present invention.

Since the technical idea of the present invention has been described above merely for illustrative purposes, various modifications and changes can be made by a person having ordinary skill in the art to which the present invention pertains without departing from the scope of essential characteristics of the present invention. Therefore, the embodiments disclosed in the present disclosure are intended for descriptive purposes without being intended to limit the technical idea of the present invention, and the scope of the technical idea of the present invention is not limited by the embodiments. The scope of the present invention shall be interpreted by the claims set forth below, and the scope of the present invention shall be interpreted as encompassing all technical ideas within the scope of equivalents thereof.

The invention claimed is:

1. A wafer cleaning brush comprising:
    a brush including a hollow formed inside the brush and through which a cleaning liquid is discharged, and a plurality of protrusions formed on an outer surface of the brush; and
    a film surrounding the outer surface of the brush,
    wherein the film includes a plurality of holes through which the protrusions pass,
    wherein a guide having a shape that protrudes inward than other regions is disposed on an inner surface of the film, which faces the outer surface of the brush.

2. The wafer cleaning brush of claim 1, wherein a material of the film includes various materials such as polyethylene terephthalate (PET) or polyvinyl chloride (PVC).

3. The wafer cleaning brush of claim 1, wherein a sectional area of the protrusion is smaller than a sectional area of the hole.

4. The wafer cleaning brush of claim 1, further comprising a nonwoven fabric disposed on a surface or an inner side of the film.

5. A wafer cleaning brush comprising:
    a brush including a hollow formed inside the brush and through which a cleaning liquid is discharged, and a plurality of protrusions formed on an outer surface of the brush; and
    a film surrounding the outer surface of the brush,
    wherein the film includes a plurality of holes through which the protrusions pass,
    wherein the film includes an inclined surface, and
    the inclined surface is disposed on an outer side of the hole.

6. The wafer cleaning brush of claim 5, wherein the inclined surface has a shape in which a distance to the outer surface of the brush gradually becomes farther as the hole becomes closer.

* * * * *